United States Patent
Aruga

(10) Patent No.: US 7,046,936 B2
(45) Date of Patent: May 16, 2006

(54) LIGHT RECEIVING ELEMENT CARRIER AND OPTICAL RECEIVER

(75) Inventor: Hiroshi Aruga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 648 days.

(21) Appl. No.: 10/120,605

(22) Filed: Apr. 12, 2002

(65) Prior Publication Data

US 2004/0208653 A1    Oct. 21, 2004

(30) Foreign Application Priority Data

Dec. 27, 2001    (JP) .............................. 2001-397895

(51) Int. Cl.
*H04B 10/06* (2006.01)
(52) U.S. Cl. ...................... 398/202; 332/246; 332/260; 257/532; 257/431
(58) Field of Classification Search ................ 398/202; 333/246, 260, 262, 101, 103, 104; 257/532, 257/431, 734; 361/784, 803
See application file for complete search history.

(56) References Cited

U.S. PATENT DOCUMENTS

2002/0070826 A1    6/2002    Aruga

FOREIGN PATENT DOCUMENTS

JP    2000-58881    2/2000

*Primary Examiner*—David C. Payne
(74) *Attorney, Agent, or Firm*—Buchanan Ingersoll PC

(57) ABSTRACT

There is provided a light receiving element carrier including first through fourth layers laminated, a differential pair of vertical vias, one of them penetrating the second layer, and the other one of them penetrating the third layer, a broad-side-coupled differential pair, one of them being located on a first boundary plane between the first and second layers, for connecting a high-frequency terminal to the one of the differential pair of vertical vias, and the other one of them being located on a third boundary plane between the third and fourth layers, for connecting another high-frequency terminal to the other one of the differential pair of vertical vias, and a differential pair of output lines located on a second boundary plane between the second and third layers, they extending on a terrace portion formed of a surface of the third layer which is partially exposed like a terrace.

16 Claims, 8 Drawing Sheets

LIGHT RECEIVING ELEMENT CARRIER AND OPTICAL RECEIVER

BACKGROUND OF THE INVENTION

1. Field of the Invention

The present invention relates to a light receiving element carrier on which a light receiving element, a preamplifier, high-frequency terminals, and so on are mounted. It also relates to an optical receiver including the light receiving element carrier as a module.

2. Description of the Prior Art

FIG. 9 is a perspective view showing the structure of a prior art light receiving element carrier disclosed in Japanese patent application publication (TOKKAI) No. 2000-58881. In FIG. 9, reference numeral 101 denotes a light receiving element, reference numeral 102 denotes a carrier, reference numeral 103 denotes a preamplifier, reference numeral 104 denotes an I/O pad, reference numeral 105 denotes an output pad, reference numeral 106 denotes a Vcc pad, reference numeral 107 denotes a Vee pad, reference numerals 108 to 112 denote carrier electrode patterns, and reference numeral 115 denotes a boding wire for connecting the light receiving element to the preamplifier.

In operation, an optical signal output from an optical fiber not shown in the figure is incident upon the light receiving element 101 by way of a lens not shown in the figure, and is converted into an equivalent electrical signal by the light receiving element 101. The electrical signal into which the optical signal is converted by the light receiving element 101 is amplified by the preamplifier 103 which is bonded to the carrier 102 made of ceramic, which is a rectangular solid, with a metal. The electrical signal amplified by the preamplifier 103 is then output from a pair of output pads 105 to the carrier electrode patterns 110 and 111. Furthermore, a power supply for the preamplifier 103 is supplied from the carrier electrode patterns 109 and 112 disposed on the carrier 102 to a plurality of Vcc pads 106 and a plurality of Vee pads 107.

The prior art light receiving element carrier of FIG. 9 has the following problems (A) to (C).

(A) When forming the carrier 102 as a module and mounting it within an optical receiver, it is necessary to dispose a lens and an optical fiber not shown in the figure in front of the light receiving element 101. However, the optical receiver s electric output terminals should be disposed so that they are flush with the carrier electrode patterns 110 and 111 connected to the pair of output pads 105 and formed on surfaces of the carrier 102 which is a rectangular solid. Therefore, the optical fiber is not flush with the electric output terminals and the height of the optical receiver is increased.

(B) Ceramic is generally used to form the carrier having the structure as shown in FIG. 9. When the amount of heat generated by the preamplifier 103 is large, it is necessary to form the carrier 103 by using expensive aluminum nitride (AlN) of a good thermal conductivity to dissipate the generated heat into a housing of the optical receiver. Thus, cheap alumina cannot be used to form the carrier and therefore the cost of the carrier is increased.

(C) Since the preamplifier 103 having a thickness is mounted on the carrier 102, a difference is caused only by the thickness of the preamplifier 103. In other words, since the pair of output pads 105 and so on formed on the preamplifier are not flush with the plurality of carrier electrode patterns 108 to 112, the length of wiring required for connecting these components with one another is increased and therefore the reflection characteristic of the pair of output pads 105 is deteriorated.

In sum, the first problem encountered in the prior art light receiving element carrier is that the optical fiber is not flush with the electric output terminals and the height of the light receiving element carrier is therefore increased when it is provided as a module.

The second problem is that cheap alumina cannot be used to form the prior art light receiving element carrier and therefore the cost of the carrier is increased.

The third problem is that the reflection characteristic of the prior art light receiving element carrier is deteriorated.

SUMMARY OF THE INVENTION

The present invention is proposed to solve the above-mentioned problems, and it is therefore an object of the present invention to provide a light receiving element carrier that can be reduced in height when it is provided as a module, and an optical receiver including the light receiving element carrier as a module.

It is another object of the present invention to provide a light receiving element carrier that can be made of cheap alumina, thereby reducing the cost of the light receiving element carrier, and an optical receiver including the light receiving element carrier as a module.

It is a further object of the present invention to provide a light receiving element carrier that can reduce degradation of its reflection characteristic, and an optical receiver including the light receiving element carrier as a module.

In accordance with an aspect of the present invention, there is provided a light receiving element carrier having a chip mounting surface, the carrier comprising: a light receiving element mounted on the chip mounting surface; a preamplifier connected to the light receiving element and mounted on the chip mounting surface; a first input terminal connected to the preamplifier and mounted on the chip mounting surface; a second input terminal connected to the preamplifier and mounted on the chip mounting surface under the first input terminal; a first intermediate line connected to the first input terminal at an end thereof, the first intermediate line extending horizontally inside the carrier; a second intermediate line connected to the second input terminal at an end thereof, the second intermediate line extending horizontally inside the carrier; a first via having an end connected to another end of the first intermediate line and another end that reaches a middle plane lying between the first and second intermediate lines; a second via having an end connected to another end of the second intermediate line and another end that reaches the middle plane; a first output line located on the middle plane and having an end connected to the other end of the first via and another end exposed at a surface opposite to the chip mounting surface; and a second output line located on the middle plane and having an end connected to the other end of the second via and another end exposed at the surface opposite to the chip mounting surface.

In accordance with another aspect of the present invention, there is provided a light receiving element carrier having a chip mounting surface, the carrier comprising: a plurality of layers laminated in a direction parallel with the chip mounting surface, the plurality of layers being separated by a plurality of boundary planes including first through third boundary planes, and the second boundary plane being located between the first and second boundary planes; a first input terminal located on a line of intersection of the first boundary plane and the chip mounting surface; a second input terminal located on a line of intersection of the third boundary plane and the chip mounting surface; first and second output lines located on the second boundary plane; a first via located between the first and second boundary planes; and a second via located between the second and third boundary planes, the first and second input terminals being electrically connected to the first and second output lines by way of the first and second vias, respectively.

In accordance with a further aspect of the present invention, there is provided a light receiving element carrier having a chip mounting surface which is substantially perpendicular to a bottom thereof, and on which a light receiving element for converting an optical signal into an electric signal, a preamplifier for amplifying the electric signal, and first and second input terminals to which the electric signal amplified by the preamplifier are inputted are mounted, the carrier comprising: first through fourth layers laminated, the first and second layers being separated by a first boundary plane, the second and third layers being separated by a second boundary plane, the third and fourth layers being separated by a third boundary plane, and the first through third boundary planes being substantially parallel with the bottom of the carrier: a terrace portion formed of a surface of the third layer which is partially exposed like a terrace; a first via penetrating the second layer from the first boundary plane to the second boundary plane; a second via penetrating the third layer from the third boundary plane to the second boundary plane; a first intermediate line located on the first boundary plane, for connecting the first input terminal to the first via; a second intermediate line located on the third boundary plane, for connecting the second input terminal to the second via; a first output line located on the second boundary plane and connected to the first via, the first output line extending on the terrace portion; and a second output line located on the second boundary plane and connected to the second via, the second output line extending on the terrace portion.

In accordance with another aspect of the present invention, a height from the bottom of the carrier to an optical axis of the light receiving element is substantially the same as that from the bottom of the carrier to the second boundary plane.

In accordance with a further aspect of the present invention, the first and second intermediate lines are arranged such that orthographic projections of them, which are obtained by projection onto the bottom of the carrier from a center of projection at infinity on an axis perpendicular to the bottom, substantially overlap each other.

In accordance with another aspect of the present invention, each of the first and second intermediate lines has a first segment that is bent in a direction substantially parallel with the chip mounting surface and that reaches a predetermined position, and a second segment that extends from the predetermined position in a direction substantially perpendicular to the chip mounting surface.

In accordance with a further aspect of the present invention, the light receiving element carrier further comprises a heat sink located between the chip mounting surface and the preamplifier, for mounting the preamplifier on the carrier.

In accordance with another aspect of the present invention, the light receiving element carrier further comprises a cutaway portion forming a step on the chip mounting surface.

In accordance with a further aspect of the present invention, the cutaway portion is formed such that the light receiving element and the preamplifier are mounted thereon, and such that the first and second input terminals, the light receiving element, and the preamplifier are substantially flush with one another with respect to a direction perpendicular to the chip mounting surface.

In accordance with another aspect of the present invention, there is provided an optical receiver comprising: a light receiving element carrier having a chip mounting surface which is substantially perpendicular to a bottom thereof, and on which a light receiving element for converting an optical signal into an electric signal, a preamplifier for amplifying the electric signal, and first and second input terminals to which the electric signal amplified by the preamplifier are inputted are mounted, the carrier including first through fourth layers laminated, the first and second layers being separated by a first boundary plane, the second and third layers being separated by a second boundary plane, the third and fourth layers being separated by a third boundary plane, and the first through third boundary planes being substantially parallel with the bottom of the carrier, a terrace portion formed of a surface of the third layer which is partially exposed like a terrace, a first via penetrating the second layer from the first boundary plane to the second boundary plane, a second via penetrating the third layer from the third boundary plane to the second boundary plane, a first intermediate line located on the first boundary plane, for connecting the first input terminal to the first via, a second intermediate line located on the third boundary plane, for connecting the second input terminal to the second via, a first output line located on the second boundary plane and connected to the first via, the first output line extending on the terrace portion, and a second output line located on the second boundary plane and connected to the second via, the second output line extending on the terrace portion; a package for housing the light receiving element carrier therein; and an optical fiber for delivering an optical signal to the light receiving element mounted on the light receiving element carrier.

In accordance with a further aspect of the present invention, a height from the bottom of the light receiving element carrier to an optical axis of the light receiving element is substantially a same as that from the bottom of the carrier to the second boundary plane.

In accordance with another aspect of the present invention, the first and second intermediate lines are arranged such that orthographic projections of them, which are obtained by projection onto the bottom of the carrier from a center of projection at infinity on an axis perpendicular to the bottom, substantially overlap each other.

In accordance with a further aspect of the present invention, each of the first and second intermediate lines has a first segment that is bent in a direction substantially parallel with the chip mounting surface and that reaches a predetermined position, and a second segment that extends from the predetermined position in a direction substantially perpendicular to the chip mounting surface.

In accordance with another aspect of the present invention, the light receiving element carrier further comprises a heat sink located between the chip mounting surface and the preamplifier, for mounting the preamplifier on the carrier.

In accordance with a further aspect of the present invention, the light receiving element carrier further comprises a cutaway portion forming a step on the chip mounting surface.

In accordance with another aspect of the present invention, the cutaway portion can be formed such that the light receiving element and the preamplifier are mounted thereon, and such that the first and second input terminals, the light receiving element, and the preamplifier are substantially flush with one another with respect to a direction perpendicular to the chip mounting surface.

Accordingly, since the optical fiber can be substantially flush with a plurality of high-frequency terminals mounted on the package housing the light receiving element carrier, the light receiving element carrier can be reduced in height when it is provided as a module as compared with prior art light receiving element carriers.

In addition, cheap alumina can be used as material of which the light receiving element carrier is made, thereby reducing the cost of the light receiving element carrier.

Furthermore, since the light receiving element, the preamplifier and the pair of input terminals can be substantially flush with one another, the length of wiring used for connecting these components with one another can be reduced to a minimum. Therefore, the high frequency characteristic can be improved. As a result, degradation of the reflection characteristic of the light receiving element carrier can be reduced.

Further objects and advantages of the present invention will be apparent from the following description of the preferred embodiments of the invention as illustrated in the accompanying drawings.

DETAILED DESCRIPTION OF THE PREFERRED EMBODIMENTS

Hereafter, preferred embodiments of the present invention will be explained. The same components or like components in each of the accompanying drawings are identified by the same characters.

Embodiment 1

Figure 1A:
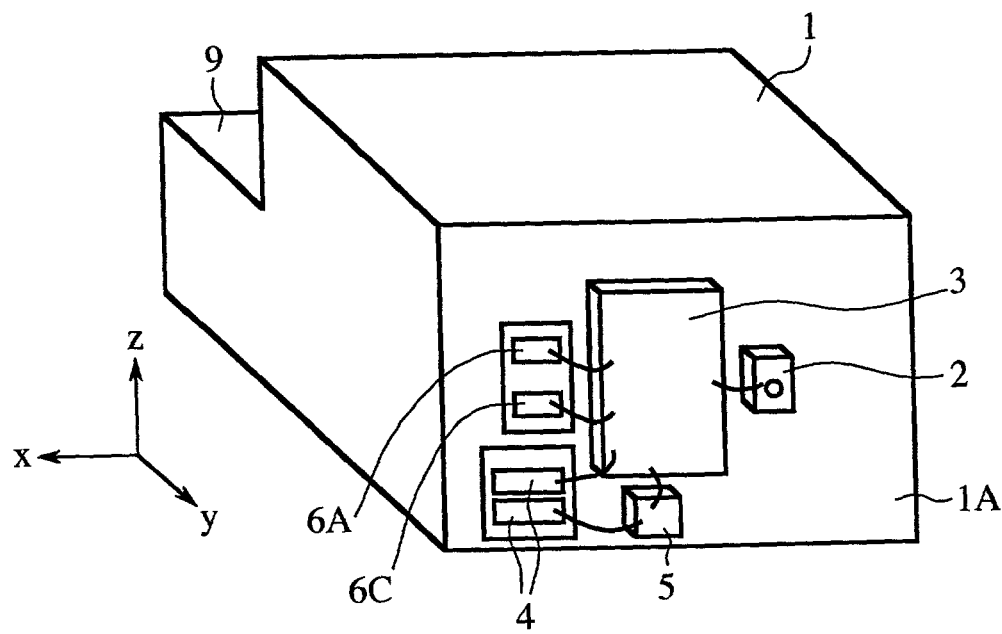
FIGS. 1A and 1B are perspective views for explaining the structures and features of a light receiving element carrier and an optical receiver according to a first embodiment of the present invention.
Figure 1B:
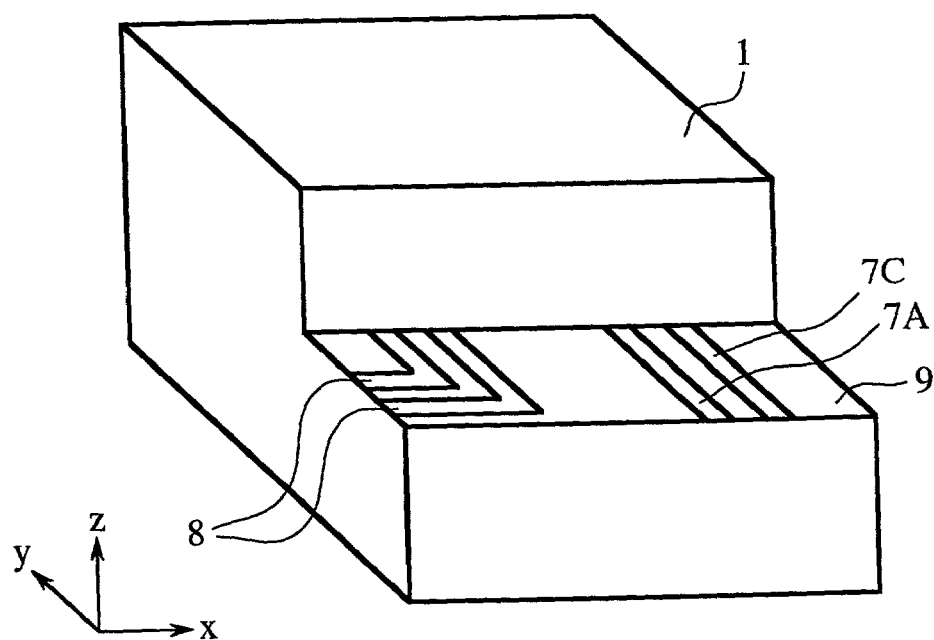
Figure 2A:
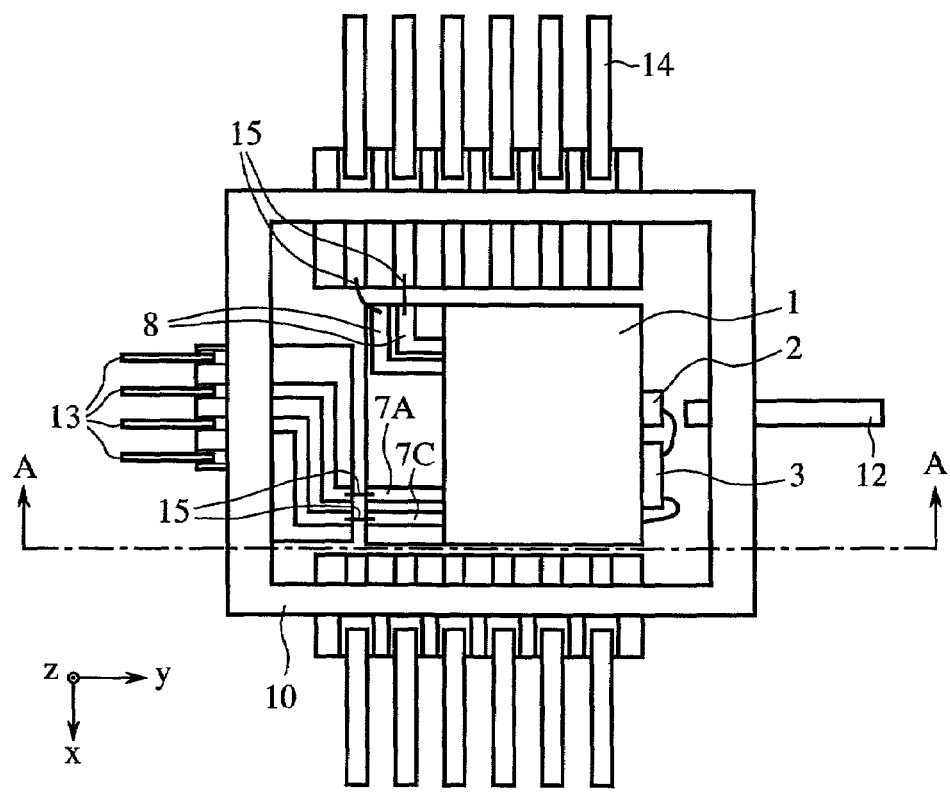
FIG. 2A is a plan view for explaining the structures and features of the light receiving element carrier and the optical receiver according to the first embodiment of the present invention.
Figure 2B:
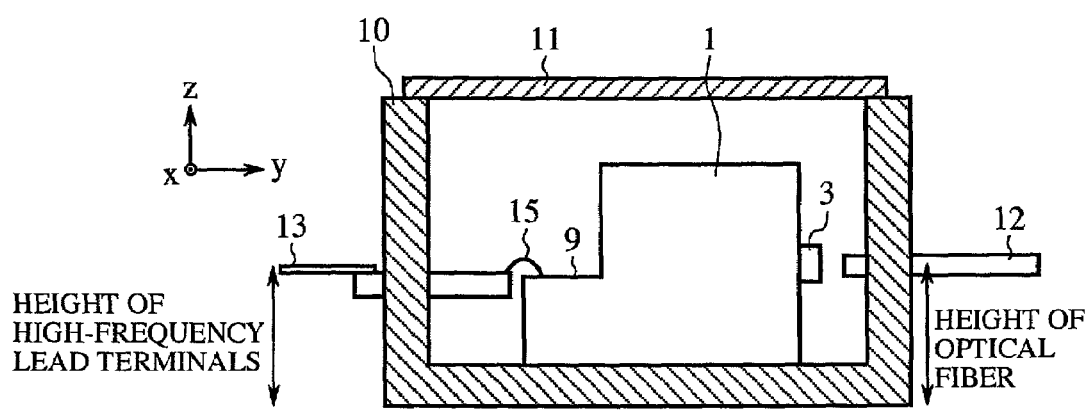
FIG. 2B is a partially cross-sectional view taken along the line A—A of FIG. 2A.

FIGS. 1A, 1B, 3 and 4A to 4D are views for explaining the structure and features of a light receiving element carrier according to a first embodiment of the present invention, and FIGS. 2A and 2B are views for explaining the structure and features of an optical receiver including the light receiving element carrier. X-, y- and z-axes perpendicular to one another are shown in these figures.

Figure 3:
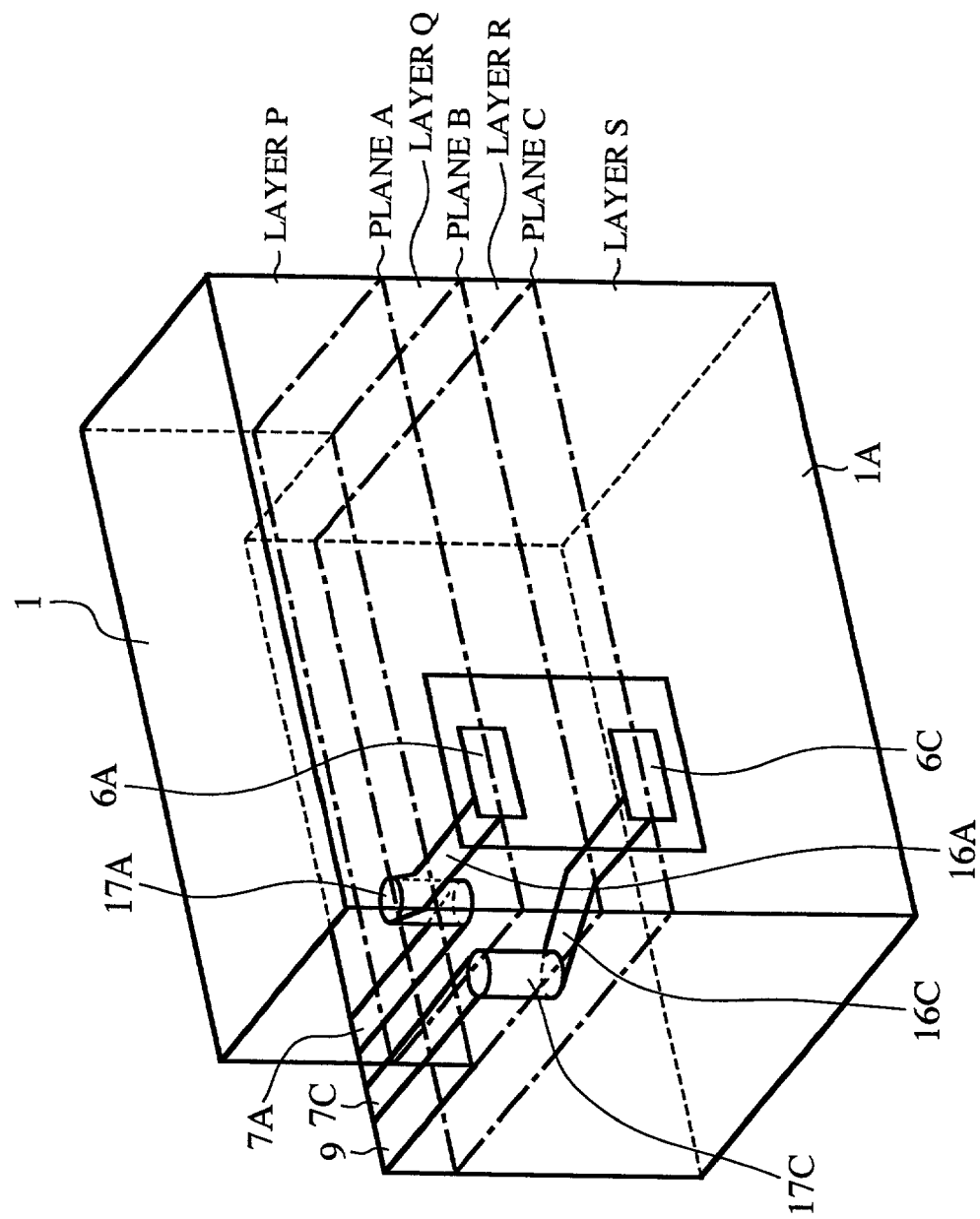
FIG. 3 is a perspective view for explaining the structures and features of the light receiving element carrier and the optical receiver according to the first embodiment of the present invention.
Figure 4A:
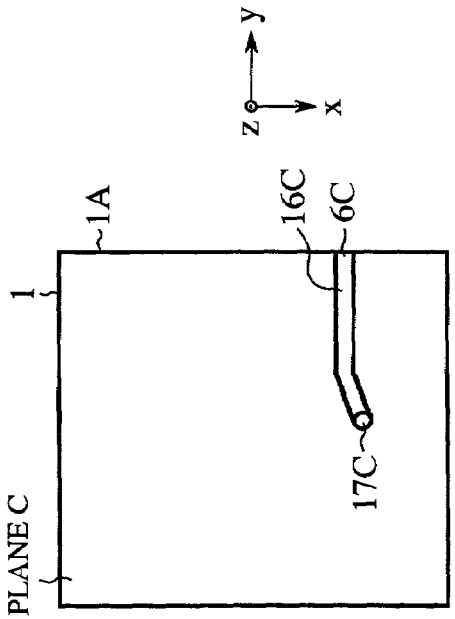
FIGS. 4A to 4D are top plan views for explaining the structure and features of the light receiving element carrier according to the first embodiment of the present invention.
Figure 4B:
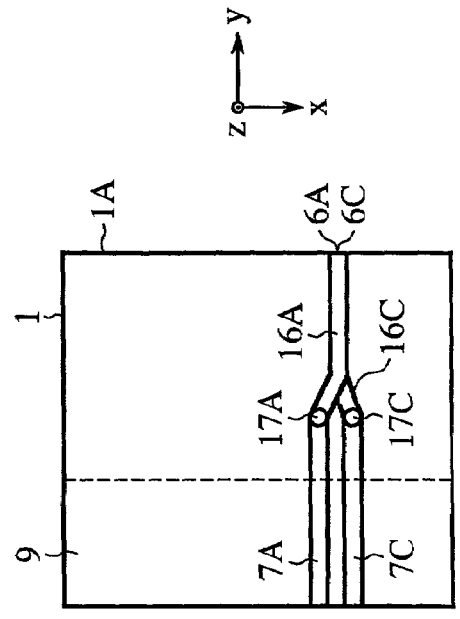
Figure 4C:
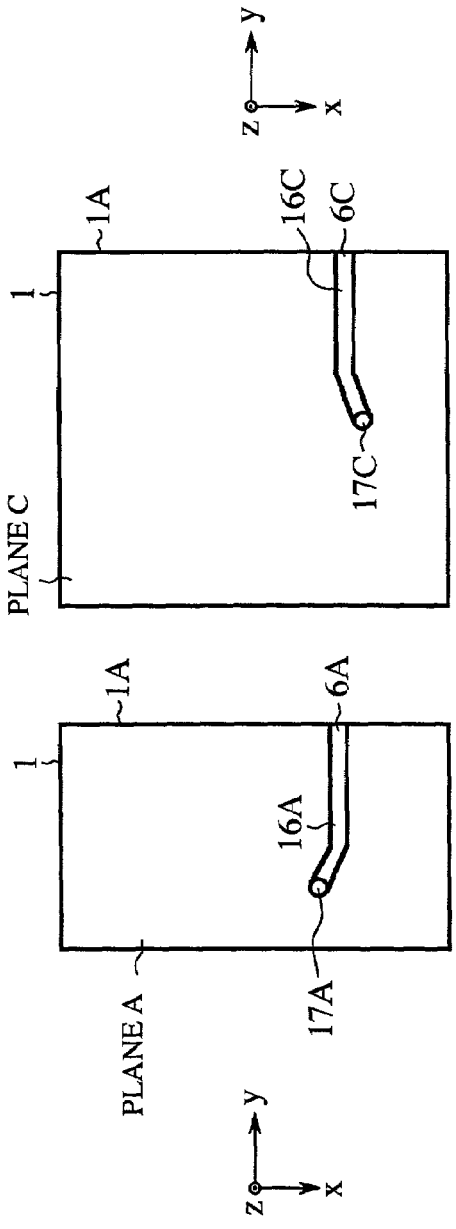
Figure 4D:
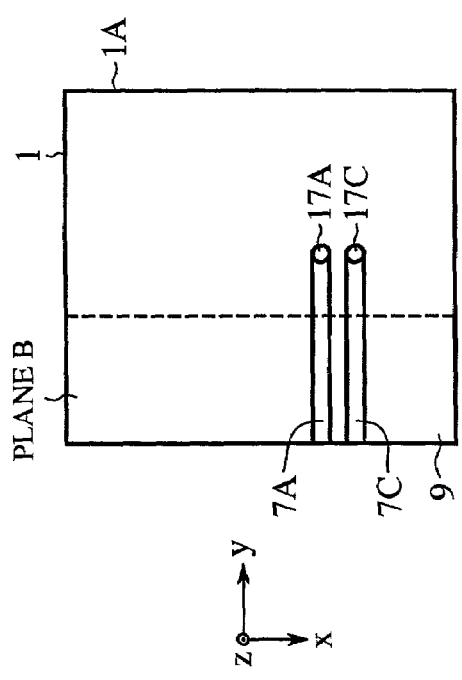

FIGS. 1A and 1B are perspective views showing the structure of the light receiving element carrier. FIG. 2A is a top plan view showing the optical receiver including the light receiving element carrier as a module when a cover is detached from the optical receiver. FIG. 2B is a partially cross-sectional view taken along the line A—A of FIG. 2A. FIG. 3 is a perspective view showing the structure of high-frequency lines of the light receiving element carrier. Furthermore, FIGS. 4A to 4C are top plan views of the high-frequency lines respectively formed on a first plane A, a second plane B and a third plane C shown in FIG. 3, and FIG. 4D is a top plan view of the high-frequency lines when seeing through the first through third planes A to C.

In FIGS. 1A and 1B, reference numeral 1 denotes a carrier, reference numeral 2 denotes a light receiving element, reference numeral 3 denotes a preamplifier, reference numeral 4 denotes a power supply terminal, reference numeral 5 denotes a capacitor, reference numeral 6A and 6B denote high-frequency terminals (first and second input terminals), reference numerals 7A and 7C denote differential lines (first and second output lines), reference numeral 8 denotes a pair of power supply lines, and reference numeral 9 denotes a terrace portion of the carrier 1.

As shown in FIGS. 1A and 1B, the pair of power supply terminals 4, the pair of high-frequency terminals 6A and 6C, the differential pair of lines 7A and 7C, and the pair of power supply lines 8 are disposed on the carrier 1. Furthermore, the light receiving element 2, the preamplifier 3, the pair of power supply terminals 4, the capacitor 5 and the pair of high-frequency terminals 6A and 6C are arranged on a front surface (i.e., a chip mounting surface 1A) of the carrier 1, and are appropriately connected to one another.

In FIGS. 2A and 2B, reference numeral 10 denotes a package, reference numeral 11 denotes a cover, reference numeral 12 denotes an optical fiber having a ball lens disposed at one end thereof, reference numeral 13 denotes a high-frequency lead terminal disposed as an electric output terminal, reference numeral 14 denotes a power lead terminal, and reference numeral 15 denotes a gold wire.

The light receiving element carrier shown in FIGS. 1A and 1B is disposed within the package 10, and the optical fiber 12 is disposed so that an optical signal from the optical fiber 12 is incident upon the light receiving element 2. Furthermore, the differential pair of lines 7A and 7C are connected to a corresponding pair of high-frequency lead terminals 13 by way of a pair of gold wires 15, and the pair of power supply lines 8 are similarly connected to a corresponding pair of power lead terminals 14 by way of a pair of gold wires 15, as shown in FIG. 2A. As can be seen from the partially cross-sectional view of FIG. 2B, in the light receiving element carrier according to the first embodiment, the optical fiber 12 is mounted at substantially the same height as the plurality of high-frequency lead terminals 13.

In FIGS. 3 and 4A to 4D, reference characters 16A and 16C denote two lines (first and second intermediate lines) included in a broadside-coupled differential pair, respectively, and reference characters 17A and 17C denote two vertical vias (first and second vias) included in a differential vertical via pair, respectively. There is provided a first plane A (first boundary) between a first layer P and a second layer Q, and therefore the first and second layers P and Q are separated by the first plane A. There is also provided a second plane B (second boundary plane or middle plane) between the second layer Q and a third layer R, and therefore the second and third layers Q and R are separated by the second plane B. There is also provided a third plane C (third boundary plane) between the third layer R and a fourth layer S, and therefore the third and fourth layers R and S are separated by the third plane C. One of the broadside-coupled differential lines, i.e., the line 16A is formed on the first plane A, and the other line 16C is formed on the third plane C. In other words, the broadside-coupled differential lines 16A and 16C are not in the same plane, as shown in FIG. 3. The names of the broadside-coupled differential lines 16A and 16C come from this. The differential vertical via 17A extends from the first plane A to the second plane B so that it penetrates the Q layer, and the other differential vertical via 17C extends from the third plane C to the second plane B so that it penetrates the R layer. Furthermore, the differential pair of lines 7A and 7C are formed on the second plane B As shown in FIG. 3, the carrier 1 consists of the first through fourth layers P to S, all of which are rectangular solids and which are laminated in the direction of the +z-axis from the bottom of the carrier 1 in order of the fourth layer S, the third layer R, the second layer Q and the first layer P. The above-mentioned four layers which constitute the carrier 1 are constructed as follows: the first layer P is a layer which is a rectangular solid which extends from the upper surface of the carrier 1 to the first plane A corresponding to a position in the direction of the z-axis of the high-frequency terminal 6A disposed on the chip mounting surface 1A perpendicular to the y-axis, the second layer Q is a layer which is a rectangular solid which extends from the first plane A to the second plane B corresponding to about a midpoint position in the direction of the z-axis between the high-frequency terminal 6A and the other high-frequency terminal 6C disposed on the chip mounting surface 1A, the third layer R is a layer which is a rectangular solid which extends from the second plane B to the third plane C corresponding to a position in the direction of the z-axis of the other high-frequency terminal 6C, and the fourth layer S is a layer which is a rectangular solid which extends from the third plane C to the bottom of the carrier 1.

While the first through fourth layers P to S have the same length with respect to the direction of the x-axis, the first and second layers P and Q have a shorter length than the third and fourth layers R and S with respect to the direction of the y-axis. Therefore, when the four layers P to S are laminated so that the chip mounting surface 1A is formed as shown in FIG. 3, the terrace portion 9 on which the differential pair of lines 7A and 7C are exposed is formed on a part of the second plane B which is located opposite to the chip mounting surface 1A, and the carrier 1 is formed as shown in FIGS. 1A and 1B. Each layer is not limited to the one which is a rectangular solid as shown in FIG. 3, and therefore the shape of the bottom of each layer is not limited to a rectangle. For example, the bottom of each layer can be a trapezoid.

In the carrier 1 of FIG. 3, the pair of high-frequency terminals 6A and 6C, which are arranged on the chip mounting surface 1A in the direction of the z-axis, are connected to the broadside-coupled differential lines 16A and 16C, respectively. As can be seen from the top plan view of the first plane A of FIG. 4A, the top plan view of the third plane C of FIG. 4C and the top plan view of FIG. 4D when seeing through the first through third planes A to C, the broadside-coupled differential lines 16A and 16C include respective bent segments which bends in opposite directions of the x-axis and other segments which overlap each other when viewed from the direction of the z-axis. The bent segment of the broadside-coupled differential line 16A has an end connected to an end of the differential vertical via 17A, the end of the differential vertical via being located on the first plane A (see FIG. 4A), and the bent segment of the other broadside-coupled differential line 16C has an end connected to an end of the other differential vertical via 17C, the end of the differential vertical via being located on the third plane C (see FIG. 4C). As shown in the top plan view of the second plane B of FIG. 4B, the differential pair of lines 7A and 7C formed on the same plane B have respective ends connected to the other ends of the differential pair of vertical vias 17A and 17C, those ends of the differential pair of vertical vias being located on the second plane B.

In FIG. 3, since the differential pair of lines 7A and 7C are placed so that their position with respect to the direction of the z-axis (i.e., the z-axis coordinate of the second plane B) agrees with a midpoint between the positions of the broadside-coupled differential lines 16A and 16C (i.e., the z-axis coordinates of the first and third planes A and C) with respect to the direction of the z-axis, the differential pair of vertical vias 17A and 17C have the same length (i.e., the Q and R layers have the same thickness with respect to the direction of the z-axis). Furthermore, the pair of power supply terminals 4 are connected to the pair of power supply lines 8 inside the carrier 1.

In operation, an optical signal input from the optical fiber 12 is focused by the ball lens disposed on the end of the optical fiber 12, and is then received by the light receiving element 2. An electrical signal having a level corresponding to the strength of the received light is input from the light receiving element 2 to the preamplifier 3. The electrical signal is then amplified by the preamplifier 3 and is output from the carrier 1 after passing through the pair of high-frequency terminals 6A and 6C, the broadside-coupled differential lines 16A and 16C, the differential pair of vertical vias 17A and 17C and the differential pair of lines 7A and 7C. The electrical signal is further output to a corresponding pair of high-frequency lead terminals 13 by way of the corresponding pair of gold wires 15. A bias supply voltage for driving the light receiving element 2 and the preamplifier 3 is supplied to the light receiving element 2 and the preamplifier 3 by way of a pair of power supply terminals 14, the other pair of gold wires 15, the pair of power supply lines 8, the pair of power supply terminals 4 and the capacitor 5.

The differential signal input from the pair of high-frequency terminals 6A and 6C is transmitted by way of the broadside-coupled differential lines 16A and 16C. As shown in the top plan view of FIG. 4D when seeing through the first through third planes A to C, since the center (x coordinate) of the broadside-coupled differential lines 16A and 16C substantially agrees with the center (x coordinate) of the differential pair of lines 7A and 7C, when the differential pair of vertical vias 17A and 17C are shortened as compared with the wavelength of the differential signal, that is, when the spacing between the broadside-coupled differential lines 16A and 16C is shortened, the symmetry of the broadside-coupled differential lines 16A and 16C and the symmetry of the differential pair of lines 7A and 7C can be ensured and the differential signal is therefore allowed to pass through the broadside-coupled differential lines 16A and 16C and the differential pair of lines 7A and 7C. Therefore, the midpoint between the pair of high-frequency terminals 6A and 6C substantially agrees with the differential pair of lines 7A and 7C (i.e., the second plane B) in height from the bottom of the carrier 1.

Furthermore, the preamplifier 3 is constructed on the assumption of differential amplification, and, in general, circuitry formed in the preamplifier 3 is so constructed that it is symmetric in view of the symmetry of its operation. Therefore, the light receiving element 2, the preamplifier 3, the pair of high-frequency terminals 6A and 6C, the differential pair of lines 7A and 7C are arranged on the carrier 1 so that their respective centers are at substantially the same height.

Thus, when constituting an optical receiver including the carrier, the centers of components starting from the optical fiber 12 to the plurality of high-frequency lead terminals 13 can be placed at the same height from the bottom of the optical receiver, as shown in FIG. 2A. Accordingly, the height of the entire optical receiver can be reduced as compared with those of prior art optical receivers. Furthermore, since the length of wiring extending from the pair of high-frequency terminals 6A and 6C to the corresponding pair of high-frequency lead terminals 13 can be shortened, the transmission loss caused in the carrier can be reduced.

As mentioned above, in accordance with the first embodiment, the light receiving element carrier 1 comprises a light receiving element 2 mounted on a chip mounting surface 1A thereof; a preamplifier 3 connected to the light receiving element 2 and mounted on the chip mounting surface 1A; a high-frequency terminal 6A connected to the preamplifier 3 and mounted on the chip mounting surface 1A; another high-frequency terminal 6B connected to the preamplifier 3 and mounted on the chip mounting surface 1A under the high-frequency terminal 6A; a broadside-coupled differential pair 16A and 16C connected to the pair of high-frequency terminals 6A and 6C at ends thereof, respectively, the broadside-coupled differential lines 16A and 16C extending horizontally inside the carrier 1; a differential vertical via 17A having an end connected to the other end of the broadside-coupled differential line 16A and another end that reaches a second plane B lying between the broadside-coupled differential lines 16A and 16C; another differential vertical via 17C having an end connected to the other end of the other broadside-coupled differential line 16B and another end that reaches the second plane B; a differential output line 7A extending horizontally on the second plane B, and having an end connected to the other end of the differential vertical via 17A and another end exposed at a surface opposite to the chip mounting surface 1A; and another differential output line 7B extending horizontally on the second plane B and having an end connected to the other end of the other differential vertical via 17C and another end exposed at the surface opposite to the chip mounting surface 1A. Accordingly, the light receiving element carrier can be reduced in height when it is provided as a module as compared with prior art light receiving element carriers, and the transmission loss caused in the light receiving element carrier can be reduced.

In addition, in accordance with the first embodiment, the light receiving element carrier 1 includes first through fourth layers P to S which are laminated from the bottom of the carrier in order of the fourth layer S, the third layer R, the second layer Q and the first layer P, the first and second layers P and Q being separated by a first plane A, the second and third layers Q and R being separated by the second plane B, the third and fourth layers R and S being separated by a third plane C, and the first through third planes being substantially parallel with the bottom of the carrier 1: a terrace portion 9 formed of a surface of the third layer R which is partially exposed like a terrace; the differential pair of vertical vias 17A and 17C, one of them 17A penetrating the second layer Q from the first plane A to the second plane B, and the other one of them 17C penetrating the third layer R from the third plane C to the second plane B; the no-coplanar differential pair of lines 16A and 16C, one of them 16A being located on the first plane A, for connecting the high-frequency terminal 6A to the differential vertical via 17A, and the other one of them 16C being located on the third plane C, for connecting the other high-frequency terminal 6C to the other differential vertical via 17C; and the differential pair of output lines 7A and 7C located on the second plane B, one of them 7A being connected to the differential vertical via 17A and extending on the terrace portion 9, and the other one of them 7C being connected to the other differential vertical via 17C and extending on the terrace portion 9. Accordingly, the light receiving element carrier can be reduced in height when it is provided as a module as compared with prior art light receiving element carriers, and the transmission loss caused in the light receiving element carrier can be reduced.

Furthermore, in accordance with the first embodiment, in the light receiving element carrier, a height from the bottom of the carrier to an optical axis of the light receiving element 2 is substantially the same as that from the bottom of the carrier to the second plane B. Accordingly, the light receiving element carrier can be reduced in height when it is provided as a module as compared with prior art light receiving element carriers, and the transmission loss caused in the light receiving element carrier can be reduced.

In addition, in accordance with the first embodiment, there is provided an optical receiver including the light receiving element carrier 1, a package 10 for housing the light receiving element carrier 1 therein; and an optical fiber 12 for delivering an optical signal to a light receiving element 2 mounted on the light receiving element carrier 1. Accordingly, the optical receiver can be reduced in height.

Embodiment 2

Referring again to the top plan view of FIG. 2A of the first embodiment, the position where the differential pair of lines 7A and 7C are extending from the carrier 1 is shifted in the direction of the +x-axis with respect to the optical fiber 12. Therefore, there is a necessity to route the differential pair of lines 7A and 7C in the package 10 when the center of the optical fiber 12 needs to be aligned with the center of the corresponding pair of high-frequency lead terminals 13 connected to the differential pair of lines 7A and 7C. In this case, it is necessary to route the two lines for the differential pair of lines 7A and 7C, and therefore an upper area of the optical receiver must be increased. An light receiving element carrier according to a second embodiment of the present invention is so constructed as to solve this problem.

FIGS. 5 and 6A to 6D are views for explaining the structure and features of the light receiving element carrier according to the second embodiment of the present invention. X-, y- and z-axes perpendicular to one another are shown in these figures.

Figure 5:
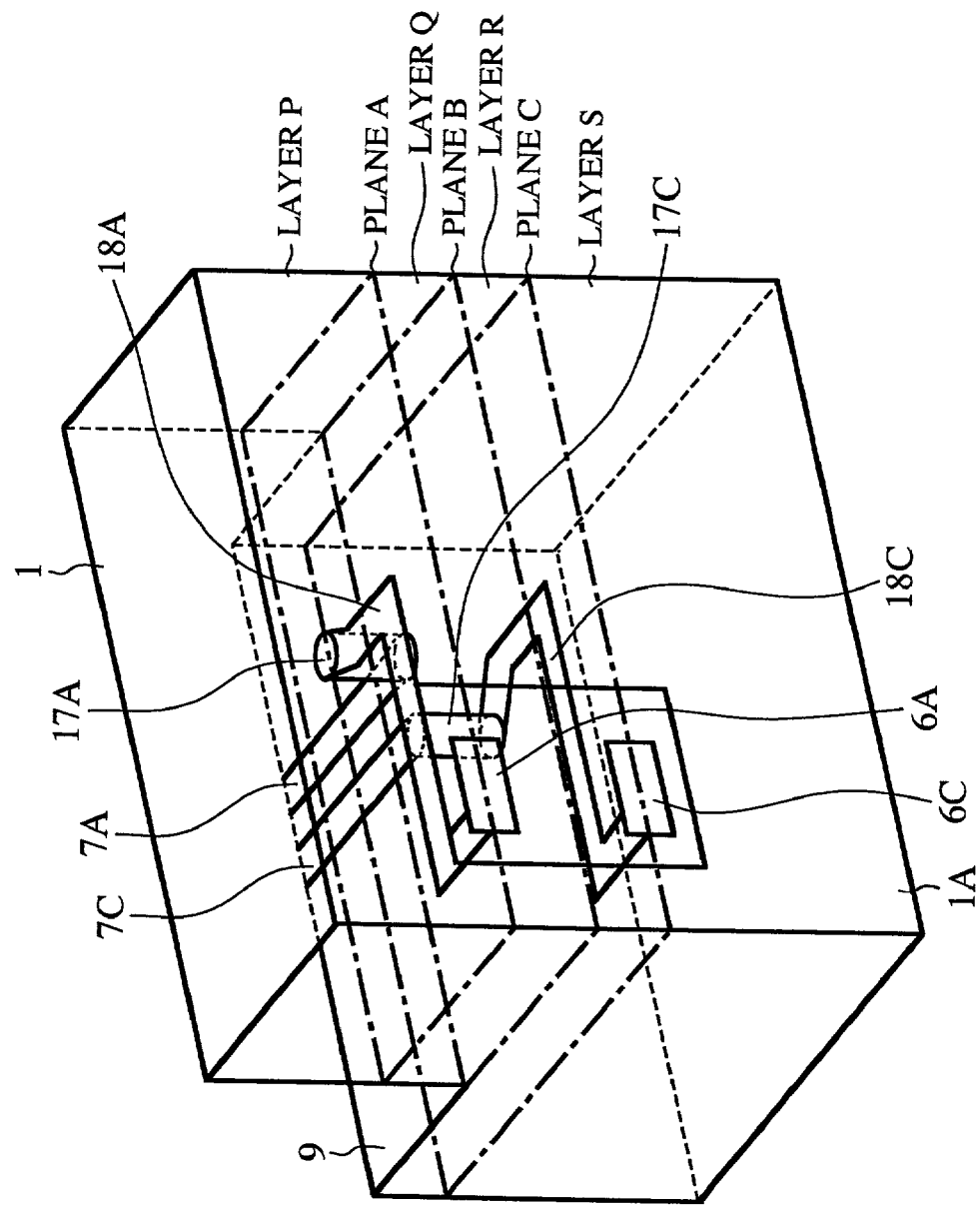
FIG. 5 is a perspective view for explaining the structure and features of a light receiving element carrier according to a second embodiment of the present invention.
Figure 6A:
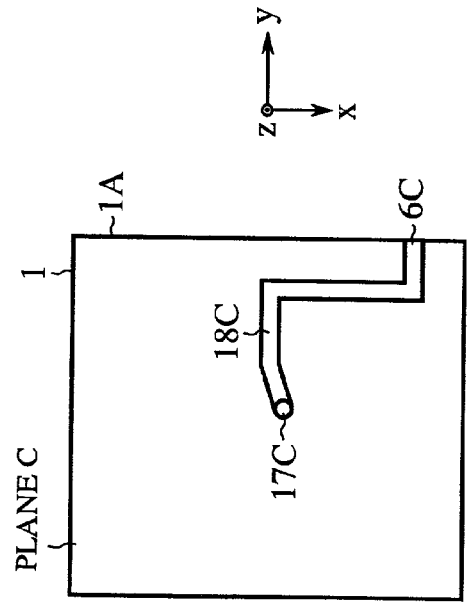
FIGS. 6A to 6D are top plan views for explaining the structure and features of the light receiving element carrier according to the second embodiment of the present invention.
Figure 6C:
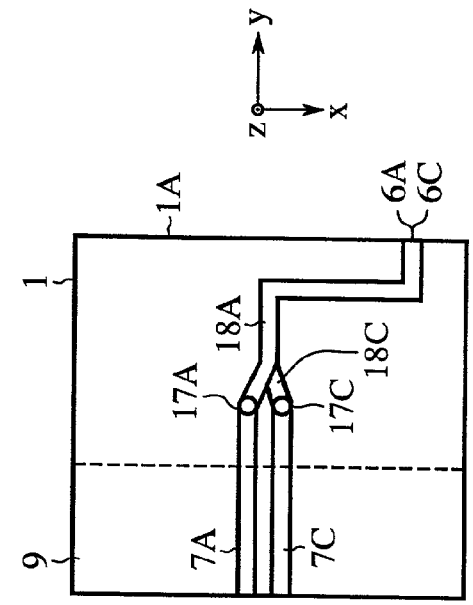
Figure 6B:
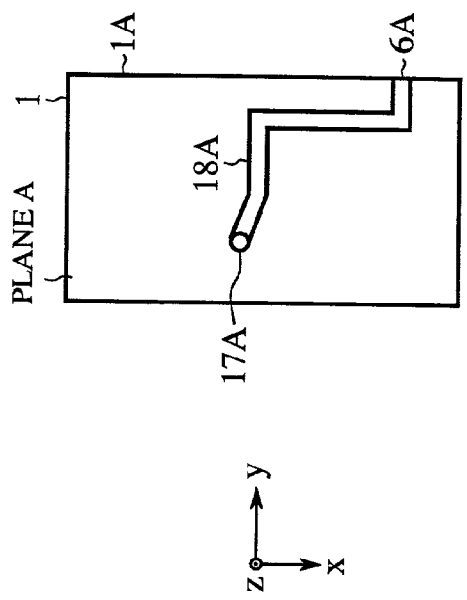
Figure 6D:
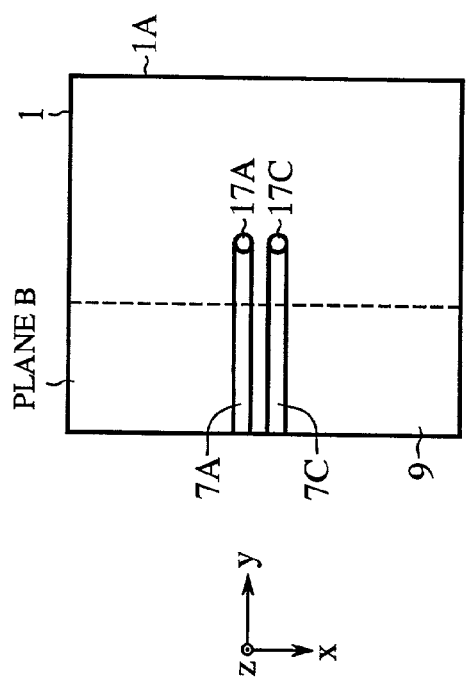

FIG. 5 is a perspective view showing the structure of high-frequency lines of the light receiving element carrier. Furthermore, FIGS. 6A to 6C are top plan views of the high-frequency lines respectively formed on a first plane A, a second plane B and a third plane C shown in FIG. 5, and FIG. 6D is a top plan view of the high-frequency lines when seeing through the first through third planes A to C.

The light receiving element carrier of the second embodiment has substantially the same structure as that of the first embodiment. The light receiving element carrier of the second embodiment differs from that of the first embodiment only in that it includes a broadside-coupled differential pair 18A and 18C (first and second intermediate lines). As shown in the top plan views of the first plane of FIG. 6A and the third plane C of FIG. 6C, each of the broadside-coupled differential lines 18A and 18C has a first segment that extends in the direction of the −y-axis from the corresponding high-frequency terminal 6A or 6C, and that is bent in the direction of the −x-axis toward the center of the carrier 1, and a second segment that extends in the direction of the −y-axis from the second segment toward a terrace portion 9. Thus, the broadside-coupled differential lines 18A and 18C connect the pair of high-frequency terminals 6A and 6C, by way of a differential pair of vertical vias 17A and 17C, to the differential pair of lines 7A and 7C.

The broadside-coupled differential lines 18A and 18C are arranged so that they substantially overlap each other when viewed along the vertical direction (the direction of the z-axis). In other words, orthographic projections of the broadside-coupled differential lines 18A and 18C onto the bottom of the carrier 1 from a center of projection at infinity on an axis perpendicular to the bottom substantially overlap each other. Therefore, the logical OR of the projections of the broadside-coupled differential lines 18A and 18C has an area substantially equal to the area of each of the broadside-coupled differential lines. As compared with the case where the differential pair of lines are routed in the package 10 other than the carrier 1 and therefore an area corresponding to the projected areas of the two lines is needed for the routing of the differential pair of lines, the carrier having the structure of FIGS. 5 and 6A to 6D makes it possible to route the broadside-coupled differential lines 18A and 18C to an arbitrary position with an area substantially equal to the projected area of only one of the two lines being needed for the routing of the differential pair of lines and therefore the length of wiring required for the routing of the differential pair of lines 7A and 7C in the package 10 can be reduced even if the differential pair of lines 7A and 7C are moved to the arbitrary position (e.g., the center of the carrier 1 when viewed from the upper surface of the carrier).

In most cases, the material of wiring used for the broadside-coupled differential lines 18A and 18C is tungsten of a high electric resistance. Although the transmission loss therefore increases because of an increase in the length of wiring used for the broadside-coupled differential lines 18A and 18C as compared with that used for the broadside-coupled differential lines 16A and 16C of the first embodiment, the carrier having the structure of FIGS. 5 and 6A to 6D makes it possible to reduce the length of wiring required for the routing of the differential pair of lines 7A and 7C in the package 10, thereby further reducing the upper area of the optical receiver.

As mentioned above, in accordance with the second embodiment, the broadside-coupled differential lines 18A and 18C are arranged such that orthographic projections of them, which are obtained by projection onto the bottom of the carrier 1 from a center of projection at infinity on an axis perpendicular to the bottom, substantially overlap each other. Accordingly, the length of wiring required for the routing of the differential pair of lines 7A and 7C in the package 10 can be reduced and therefore the upper area of the optical receiver can be reduced.

In addition, in accordance with the second embodiment, each of the broadside-coupled differential lines 18A and 18C has a first segment that is bent in a direction substantially parallel with the chip mounting surface 1A and that reaches a predetermined position, and a second segment that extends from the predetermined position in a direction substantially perpendicular to the chip mounting surface 1A. Accordingly, the routing of the differential pair of lines 7A and 7C in the package 10 can be omitted and therefore the upper area of the optical receiver can be further reduced.

Embodiment 3

Figure 7:
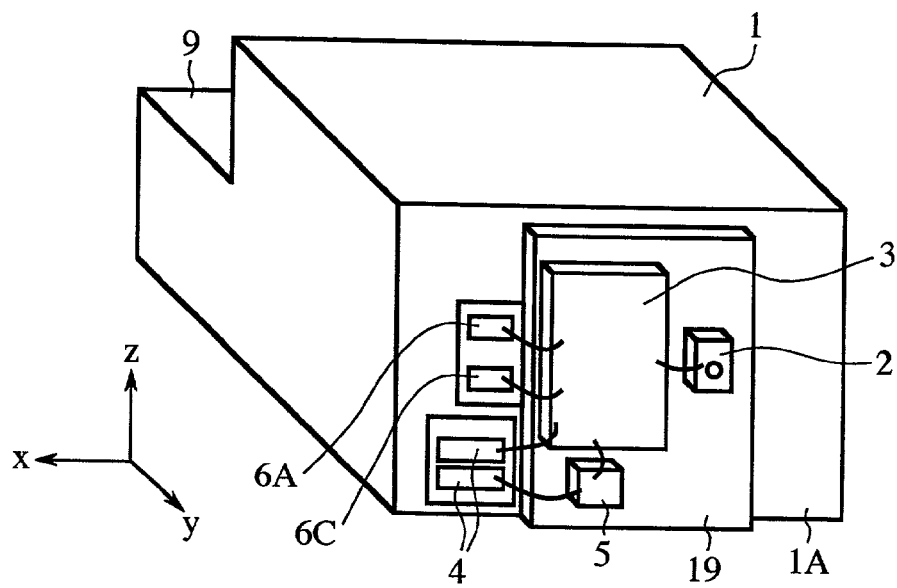
FIG. 7 is a perspective view for explaining the structure and features of a light receiving element carrier according to a third embodiment of the present invention.

FIG. 7 is a perspective view showing the structure and features of a light receiving element carrier according to a third embodiment of the present invention. In FIG. 7, reference numeral 19 denotes a metallic plate (heat sink) made of a metal of a good thermal conductivity, such as copper tungsten or covar, and used for dissipating heat from a preamplifier 3.

In the third embodiment, the metallic plate 19 is disposed under a bottom of the preamplifier 3 mounted on the carrier 1. In other words, the preamplifier 3 is installed on a chip mounting surface 1A of the carrier 1 by way of the metallic plate 19 disposed between the chip mounting surface 1A of the carrier 1 and the preamplifier 3. The metallic plate 19 makes it possible for heat generated by the preamplifier 3 to pass through the metallic plate 19 and reach a package 10 within which the carrier 1 is mounted, so that the heat is dissipated.

Thus, since it is possible to dissipate the heat generated by the preamplifier 3 by using the metallic plate 19 even when the amount of heat generated by the preamplifier 3 is large, alumina of a good thermal conductivity, which is cheaper than aluminum nitride, can be used as material of which the carrier 1 is made, thereby reducing the cost of the light receiving element carrier. The third embodiment can be applied to any one of the above-mentioned first and second embodiments.

As mentioned above, in accordance with the third embodiment, since the carrier 1 includes a metallic plate 19 disposed between the chip mounting surface 1A of the carrier 1 and the preamplifier 3, for installing the preamplifier 3 on the carrier 1 and for dissipating heat generated by the preamplifier 3, cheap alumina can be used as material of which the carrier 1 is made, thereby reducing the cost of the light receiving element carrier.

Embodiment 4

Figure 8:
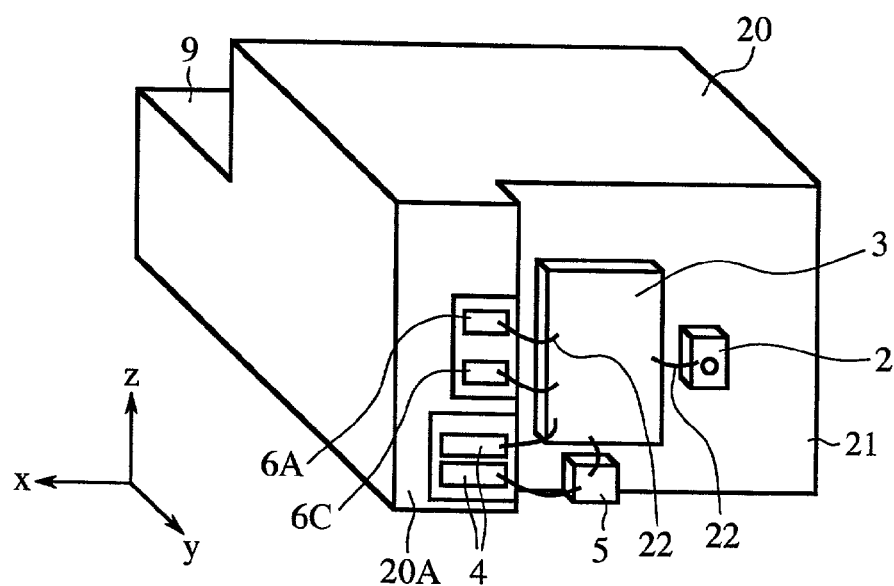
FIG. 8 is a perspective view for explaining the structure and features of a light receiving element carrier according to a fourth embodiment of the present invention.
Figure 9:
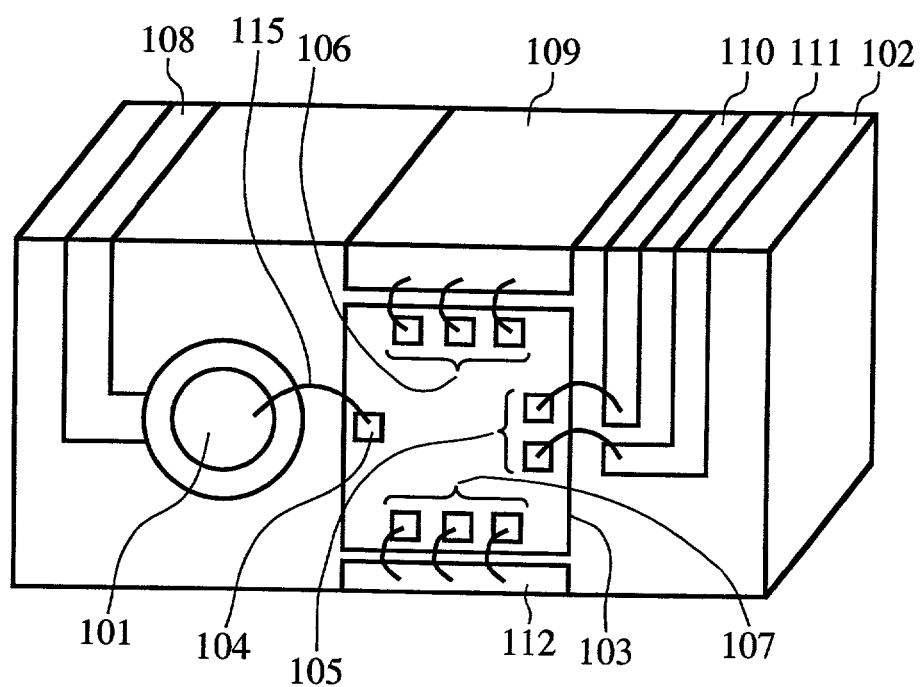
FIG. 9 is a perspective view showing the structure of a prior art light receiving element carrier.

FIG. 8 is a perspective view showing the structure and features of a light receiving element carrier according to a fourth embodiment of the present invention. In FIG. 8, reference numeral 20 denotes a cutaway carrier, and reference numeral 21 denotes a cutaway portion formed on a chip mounting surface 20A of the cutaway carrier 20.

The cutaway carrier 20 according to the fourth embodiment shown in FIG. 8 can be produced by cutting away a part of the chip mounting surface of the carrier 1 according to any one of the above-mentioned first and second embodiments. A pair of high-frequency terminals 6A and 6B are arranged on the chip mounting surface 20A of the carrier, like those of the carrier of any one of the above-mentioned first and second embodiments. Similarly, a broadside-coupled differential pair, a differential pair of vertical vias and a differential pair of output lines are disposed in the carrier 1, like those of the carrier according any one of the above-mentioned first and second embodiments. The cutaway portion 21 formed on the cutaway carrier 20 has a surface which is stepped with respect to the chip mounting surface 20A by another surface substantially perpendicular to the chip mounting surface 20A and parallel to the y-z plane. A light receiving element 2, a preamplifier 3 and a capacitor 5 are arranged on the stepped surface, i.e., the cutaway portion 21. Furthermore, as shown in FIG. 8, the cutaway portion 21 is so formed that it is extending through four layers P to S as shown in FIG. 3 or 5. When the height of the step or difference (in the direction of the y-axis) formed on the chip mounting surface is determined so that when mounting the light receiving element 2 and the preamplifier 3 on the cutaway portion 21, they are substantially flush with the pair of high-frequency terminals 6A and 6C placed on the chip mounting surface 20A.

Accordingly, since the light receiving element 2, the preamplifier 3 and the pair of high-frequency terminals 6A and 6C can be substantially flush with one another, the length of wiring 22 used for connecting these components with one another can be reduced to a minimum. Therefore, the high frequency characteristic can be improved. As a result, degradation of the reflection characteristic of the light receiving element carrier can be reduced. The fourth embodiment can be applied to any one of the above-mentioned first through third embodiments.

As mentioned above, in accordance with the fourth embodiment, since the carrier 20 is provided with a cutaway portion 21 having a surface which is stepped with respect to the chip mounting surface 20A by another surface substantially perpendicular to both the chip mounting surface 20A and the bottom of the carrier 20, and the cutaway portion 21 is formed on the chip mounting surface 20A so that it is extending through four layers P to S, the length of wiring 22 used for connecting the light receiving element 2, the preamplifier 3, and the pair of high-frequency terminals 6A and 6C with one another can be reduced and therefore the high frequency characteristic can be improved.

In addition, in accordance with the fourth embodiment, the cutaway portion 21 of the cutaway carrier 20 is formed such that the light receiving element 2 and the preamplifier 3 are mounted thereon, and such that the pair of high-frequency terminals 6A and 6C, the light receiving element 2, and the preamplifier 3 are substantially flush with one another with respect to a direction perpendicular to the chip mounting surface 20A. Accordingly, the length of wiring 22 used for connecting the light receiving element 2, the preamplifier 3 and the pair of high-frequency terminals 6A and 6C with one another can be reduced to a minimum and therefore the high frequency characteristic can be further improved.

Many widely different embodiments of the present invention may be constructed without departing from the spirit and scope of the present invention. It should be understood that the present invention is not limited to the specific embodiments described in the specification, except as defined in the appended claims.

What is claimed is:

1. A light receiving element carrier having a chip mounting surface, said carrier comprising:
    a light receiving element mounted on the chip mounting surface;
    a preamplifier connected to said light receiving element and mounted on the chip mounting surface;
    a first input terminal connected to said preamplifier and mounted on the chip mounting surface;
    a second input terminal connected to said preamplifier and mounted on the chip mounting surface under said first input terminal;
    a first intermediate line connected to said first input terminal at an end thereof, said first intermediate line extending horizontally inside said carrier;
    a second intermediate line connected to said second input terminal at an end thereof, said second intermediate line extending horizontally inside said carrier;
    a first via having an end connected to another end of said first intermediate line and another end that reaches a middle plane lying between said first and second intermediate lines;
    a second via having an end connected to another end of said second intermediate line and another end that reaches the middle plane;
    a first output line located on the middle plane, and having an end connected to the other end of said first via and another end exposed at a surface opposite to the chip mounting surface; and
    a second output line located on the middle plane, and having an end connected to the other end of said second via and another end exposed at the surface opposite to the chip mounting surface.

2. A light receiving element carrier having a chip mounting surface, said carrier comprising:
    a plurality of layers laminated in a direction parallel with the chip mounting surface, said plurality of layers being separated by a plurality of boundary planes including first through third boundary planes, and the second boundary plane being located between the first and third boundary planes;
    a first input terminal located on a line of intersection of the first boundary plane and the chip mounting surface;
    a second input terminal located on a line of intersection of the third boundary plane and the chip mounting surface;
    first and second output lines located on the second boundary plane;
    a first via located between the first and second boundary planes; and
    a second via located between the second and third boundary planes,
    wherein said first and second input terminals are electrically connected to said first and second output lines by way of said first and second vias, respectively.

3. A light receiving element carrier having a chip mounting surface which is substantially perpendicular to a bottom thereof, and on which a light receiving element for converting an optical signal into an electric signal, a preamplifier for amplifying the electric signal, and first and second input terminals to which the electric signal amplified by the preamplifier are inputted are mounted, said carrier comprising:
    first through fourth layers laminated, said first and second layers being separated by a first boundary plane, said second and third layers being separated by a second boundary plane, said third and fourth layers being separated by a third boundary plane, and said first through third boundary planes being substantially parallel with the bottom of said carrier;
    a terrace portion formed of a surface of said third layer which is partially exposed;
    a first via penetrating said second layer from said first boundary plane to said second boundary plane;
    a second via penetrating said third layer from said third boundary plane to said second boundary plane;

a first intermediate line located on said first boundary plane, for connecting said first input terminal to said first via;

a second intermediate line located on said third boundary plane, for connecting said second input terminal to said second via;

a first output line located on said second boundary plane and connected to said first via, said first output line extending on said terrace portion; and a second output line located on the second boundary plane and connected to said second via, said second output line extending on said terrace portion.

4. The light receiving element carrier according to claim 3, wherein a height from the bottom of said carrier to an optical axis of said light receiving element is substantially a same as that from the bottom of said carrier to said second boundary plane.

5. The light receiving element carrier according to claim 3, wherein said first and second intermediate lines are arranged such that orthographic projections of them, which are obtained by projection onto the bottom of said carrier from a center of projection at infinity on an axis perpendicular to the bottom, substantially overlap each other.

6. The light receiving element carrier according to claim 3, wherein each of said first and second intermediate lines has a first segment that is bent in a direction substantially parallel with the chip mounting surface and that reaches a predetermined position, and a second segment that extends from the predetermined position in a direction substantially perpendicular to the chip mounting surface.

7. The light receiving element carrier according to claim 3, further comprising a heat sink located between the chip mounting surface and said preamplifier, for mounting said preamplifier on said carrier.

8. The light receiving element carrier according to claim 3, further comprising a cutaway portion forming a step on the chip mounting surface.

9. The light receiving element carrier according to claim 8, wherein said cutaway portion is formed such that said light receiving element and said preamplifier are mounted thereon, and such that said first and second input terminals, said light receiving element, and said preamplifier are substantially flush with one another with respect to a direction perpendicular to the chip mounting surface.

10. An optical receiver comprising:

a light receiving element carrier having a chip mounting surface which is substantially perpendicular to a bottom thereof, and on which a light receiving element for converting an optical signal into an electric signal, a preamplifier for amplifying the electric signal, and first and second input terminals to which the electric signal amplified by the preamplifier are inputted are mounted, said carrier including first through fourth layers laminated, said first and second layers being separated by a first boundary plane, said second and third layers being separated by a second boundary plane, said third and fourth layers being separated by a third boundary plane, and said first through third boundary planes being substantially parallel with the bottom of said carrier, a terrace portion formed of a surface of said third layer which is partially exposed, a first via penetrating said second layer from said first boundary plane to said second boundary plane, a second via penetrating said third layer from said third boundary plane to said second boundary plane, a first intermediate line located on said first boundary plane, for connecting said first input terminal to said first via, a second intermediate line located on said third boundary plane, for connecting said second input terminal to said second via, a first output line located on said second boundary plane and connected to said first via, said first output line extending on said terrace portion, and a second output line located on the second boundary plane and connected to said second via, said second output line extending on said terrace portion;

a package for housing said light receiving element carrier therein; and an optical fiber for delivering an optical signal to said light receiving element mounted on said light receiving element carrier.

11. The optical receiver according to claim 10, wherein a height from the bottom of said light receiving element carrier to an optical axis of said light receiving element is substantially a same as that from the bottom of said carrier to said second boundary plane.

12. The optical receiver according to claim 10, wherein said first and second intermediate lines are arranged such that orthographic projections of them, which are obtained by projection onto the bottom of said carrier from a center of projection at infinity on an axis perpendicular to the bottom, substantially overlap each other.

13. The optical receiver according to claim 10, wherein each of said first and second intermediate lines has a first segment that is bent in a direction substantially parallel with the chip mounting surface and that reaches a predetermined position, and a second segment that extends from the predetermined position in a direction substantially perpendicular to the chip mounting surface.

14. The optical receiver according to claim 10, wherein said light receiving element carrier further comprises a heat sink located between the chip mounting surface and said preamplifier, for mounting said preamplifier on said carrier.

15. The optical receiver according to claim 10, wherein said light receiving element carrier further comprises a cutaway portion forming a step on the chip mounting surface.

16. The optical receiver according to claim 15, wherein said cutaway portion is formed such that said light receiving element and said preamplifier are mounted thereon, and such that said first and second input terminals, said light receiving element, and said preamplifier are substantially flush with one another with respect to a direction perpendicular to the chip mounting surface.

* * * * *